United States Patent [19]
Wu et al.

[11] Patent Number: 6,037,887
[45] Date of Patent: Mar. 14, 2000

[54] PROGRAMMABLE GAIN FOR DELTA SIGMA ANALOG-TO-DIGITAL CONVERTER

[75] Inventors: Miaochen Wu; Timothy V. Kalthoff; Binan Wang, all of Tucson, Ariz.

[73] Assignee: Burr-Brown Corporation, Tucson, Ariz.

[21] Appl. No.: 08/611,640

[22] Filed: Mar. 6, 1996

[51] Int. Cl.$^7$ ................................................ H03M 3/00
[52] U.S. Cl. ........................................ 341/143; 341/139
[58] Field of Search .................................. 341/143, 139, 341/118, 120

[56] References Cited

U.S. PATENT DOCUMENTS

| | | | |
|---|---|---|---|
| 4,588,981 | 5/1986 | Senn | 340/347 |
| 4,851,841 | 7/1989 | Sooch | 341/143 |
| 4,876,544 | 10/1989 | Kuraishi | 341/166 |
| 4,896,156 | 1/1990 | Garverick | 341/143 |
| 5,134,401 | 7/1992 | McCartney et al. | 341/143 |
| 5,305,004 | 4/1994 | Fattaruso | 341/120 |
| 5,345,236 | 9/1994 | Sramek, Jr. | 341/144 |
| 5,363,102 | 11/1994 | Ferguson, Jr. | 341/172 |

*Primary Examiner*—Jeffrey A. Gaffin
*Assistant Examiner*—Jason L W Kost
*Attorney, Agent, or Firm*—Cahill, Sutton & Thomas P.L.C.

[57] ABSTRACT

A programmable gain delta sigma analog-to-digital converter includes an analog input terminal receiving an analog input voltage, a charge summing conductor, an input capacitive switching circuit, and a feedback reference capacitive switching circuit coupled to the charge summing conductor. An integrator is coupled between the charge summing conductor and a comparator which supplies a stream of digital pulses to a digital filter that produces a digital number representing the analog input voltage. The feedback reference capacitive switching circuit includes a plurality of reference sampling capacitors, selectively coupling charge between a feedback reference voltage source and an integrating capacitor of the integration in response to a programmable gain control circuit so as to provide a selected gain for the analog-to-digital converter. The sampling rate of the capacitive switching circuits is adjusted proportionally to the selected gain to improve the dynamic range of the analog-to-digital converter.

27 Claims, 5 Drawing Sheets

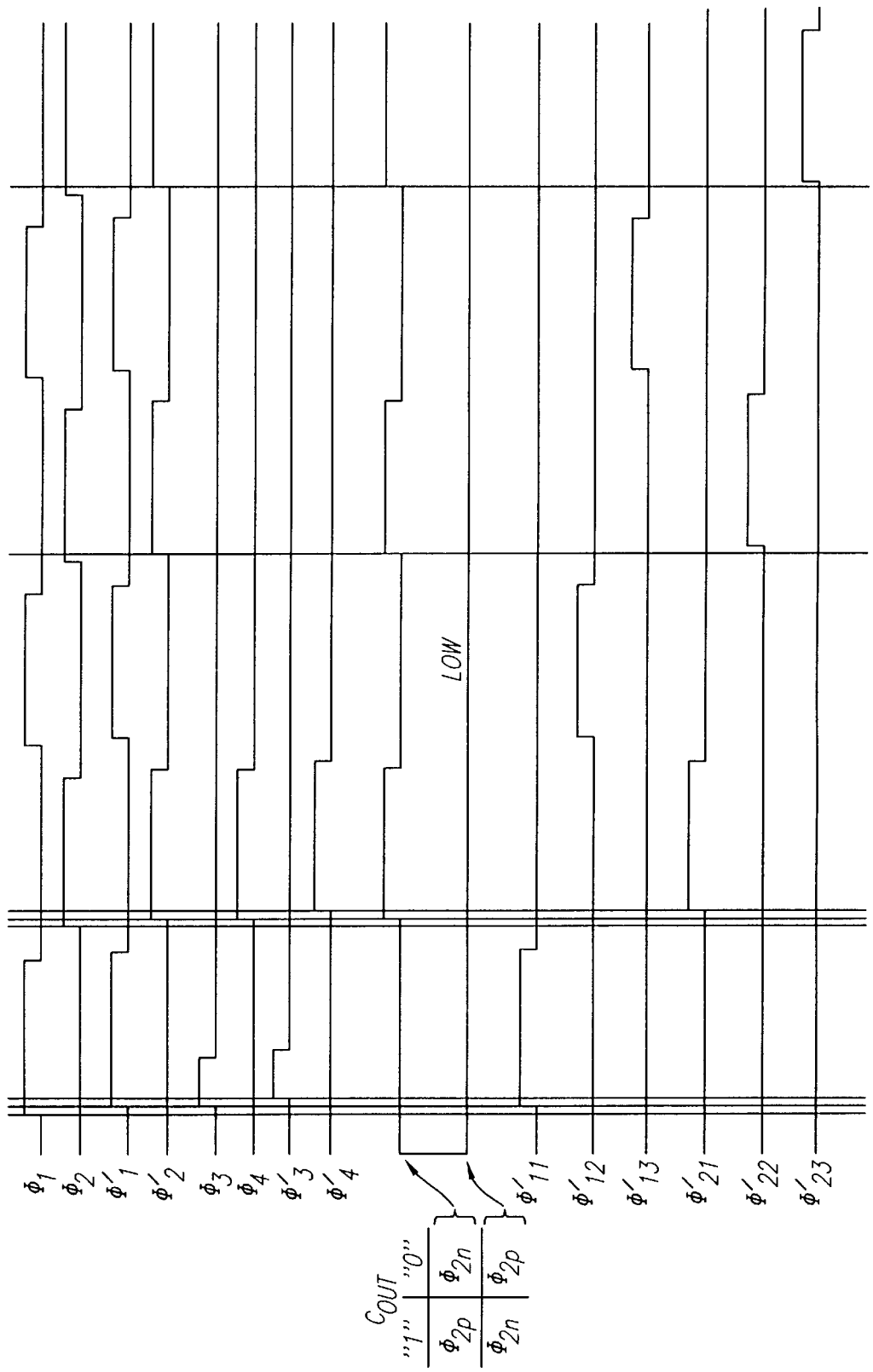

PROGRAMMABLE GAIN FOR DELTA SIGMA ANALOG-TO-DIGITAL CONVERTER

BACKGROUND OF THE INVENTION

The invention relates to delta sigma converters, particularly to those useful in analog-to-digital converters, and more particularly to such delta sigma modulators which have programmable gain.

By way of background, delta sigma modulators are commonly used in analog-to-digital converters. A delta sigma modulator for use in analog-to-digital converters is described in U.S. Pat. No. 5,134,401 (McCartney et al.) entitled "DELTA SIGMA MODULATOR HAVING PROGRAMMABLE GAIN/ATTENUATION", issued Jul. 28, 1992 and incorporated herein by reference. The McCartney et al. patent is the closest prior art presently known to the inventors. It discloses a delta sigma modulator in which the gain is programmable by selectively controlling the rate of sampling of an analog input $V_{IN}$ relative to the rate of sampling a feedback reference $V_{REF}$. U.S. Pat. No. 4,588,981 (Senn), which is discussed at length in the McCartney et al. patent, discloses an analog-to-digital converter using a delta sigma modulator.

FIG. 3 of the McCartney et al. patent is included herein as FIG. 4, labeled "PRIOR ART". In the device shown in prior art FIG. 4, the digital output 111 of buffer 110 of a delta sigma modulator 81 is a digital representation of the analog input signal $V_{IN}$. The "gain" of the delta sigma modulator 81 can be thought of as the ratio between the filtered value of an output signal on conductor 111 and the value of the analog input voltage $V_{IN}$. The gain also can be thought of as the ratio of the amount of charge transferred from the input sampling capacitor $C_{IN}$ to integration capacitor C13 during a comparator decision cycle to the amount of charge transferred from the feedback reference capacitor $C_{REF}$ to integration capacitor C13 during the comparator decision cycle.

The gain is increased for the prior art delta sigma modulator 81 shown in prior art FIG. 4 by increasing the amount of charge transferred onto integrating capacitor C13 as a result of sampling $V_{IN}$ onto capacitor $C_{IN}$ relative to the amount of charge transferred onto integrating capacitor $C_{13}$ as a result of sampling a reference voltage $V_{REF}$ onto sampling capacitor $C_{REF}$.

Increasing the "gain" of the delta sigma modulator can be understood by recognizing that the output buffer can contain a "maximum" number, which can be thought of as a "full scale" value. It is desirable to be able to convert a first range of relatively small values of $V_{IN}$ to corresponding digital numbers which represent the value of $V_{IN}$. The largest such digital number, which is the "full scale" value of the output buffer 110, should represent the maximum value of $V_{IN}$ in the first range. It also is desirable to be able to convert a second range (and additional ranges) of relatively larger values of $V_{IN}$ to corresponding digital numbers. The largest digital number of each range is the same "full scale" value of the output buffer and corresponds to the maximum value of $V_{IN}$ for that range. Therefore, in order to obtain the desirable correspondence between various maximum values of $V_{IN}$ (for various ranges) and the same full scale digital number of output buffer 110, it is necessary to be able to adjust the "gain" of delta sigma modulator 81 so that the largest expected value of $V_{IN}$ corresponds to the full scale digital value of output buffer 110.

The gain of the prior art delta sigma modulator 81 shown in prior art FIG. 4 is adjusted by sampling $V_{IN}$ onto sampling capacitor $C_{IN}$ and then transferring its charge onto integrating capacitor C13 at a different rate than the rate of sampling $V_{REF}$ onto sampling capacitor $C_{REF}$ and transferring its charge onto integrating capacitor C13.

The delta sigma modulator 81 shown in prior art FIG. 4 includes a programmable control unit 112 which can be controlled by the user to set the gain of the delta sigma modulator 81. This is accomplished by setting the ratio of the sampling rate of the analog input $V_{IN}$ relative to the sampling rate of the reference voltage $V_{REF}$. The McCartney et al. patent explains that changing the gain of the delta sigma modulator of the above mentioned Senn patent is inconvenient because it requires exchanging sampling capacitors. To avoid that shortcoming, McCartney et al. adjust the gain of the delta sigma modulator by adjusting the ratio of the rate at which the analog input $V_{IN}$ is sampled onto the integrating capacitor C13 relative to the rate at which the reference voltage $V_{REF}$ is sampled onto integration capacitor C13.

SUMMARY OF THE INVENTION

Accordingly, it is an object of the invention to provide a delta sigma modulator in which the gain is programmable independently of the ratio of the rates of sampling the analog input voltage and the feedback reference voltage.

It is another object of the invention to provide a delta sigma modulator in which the gain is programmable independently of the ratio of the rates of sampling the analog input voltage and the feedback reference voltage and in which the dynamic range or signal-to-noise ratio is not unduly compromised.

It is another object of the invention to provide a delta sigma modulator or delta sigma analog-to-digital converter in which offset errors and other errors are easily corrected.

It is another object of the invention to provide a delta sigma modulator or delta sigma analog-to-digital converter and technique providing highly linear gain adjustment.

It is another object of the invention to avoid loss of dynamic range or signal-to-noise ratio of a delta sigma modulator or delta sigma analog-to-digital converter as a result of decreasing the reference feedback voltage sampling capacitance thereof.

It is another object of the invention to avoid loss of bandwidth of a delta sigma modulator or delta sigma analog-to-digital converter as a result of decreasing the reference feedback voltage sampling capacitor thereof.

Briefly described, and in accordance with one embodiment thereof, the invention provides a programmable gain delta sigma analog-to-digital converter including an analog input terminal receiving an analog input voltage, a charge summing conductor, a first capacitive switching circuit including an input sampling capacitor, first sampling switch circuitry coupled to the analog input terminal and the input sampling capacitor to charge the input sampling capacitor to the input voltage, and second capacitive switching circuitry coupled to the input sampling capacitor and the charge summing conductor to transfer charge from the input sampling capacitor to the charge summing conductor. An integrator including an amplifier and an integrating capacitor is coupled between the charge summing conductor and a comparator that includes a first input coupled to the output of the amplifier and a second input coupled to receive a fixed reference voltage. A digital filter is coupled to receive a stream of digital pulses from an output of the comparator and adapted to produce a digital number that precisely represents the analog input voltage. A second capacitive switching circuit includes a plurality of reference sampling capacitors, third switching circuitry selectively coupling a feedback reference voltage to the reference sampling capacitors, respectively, to selectively charge the reference sampling capacitors to the feedback reference voltage, and fourth switching circuitry selectively coupling the reference sampling capacitors, respectively, to the charge summing conductor. Programmable gain control circuitry is coupled to the output of the comparator for selectively controlling the number of reference sampling capacitors coupled to the feedback reference voltage generally proportionally to the inverse of a preselected gain. In the described embodiment, the programmable gain control circuitry includes sampling rate control circuitry adapted to increase the common sampling rate of the first and second capacitive switching circuits generally proportionally to the preselected gain.

BRIEF DESCRIPTION OF THE DRAWINGS

FIG. 3B is a timing diagram showing the waveforms of the clock signals applied to the delta sigma analog-to-digital converter of FIG. 2.

DETAILED DESCRIPTION OF THE PREFERRED EMBODIMENTS

Figure 1:
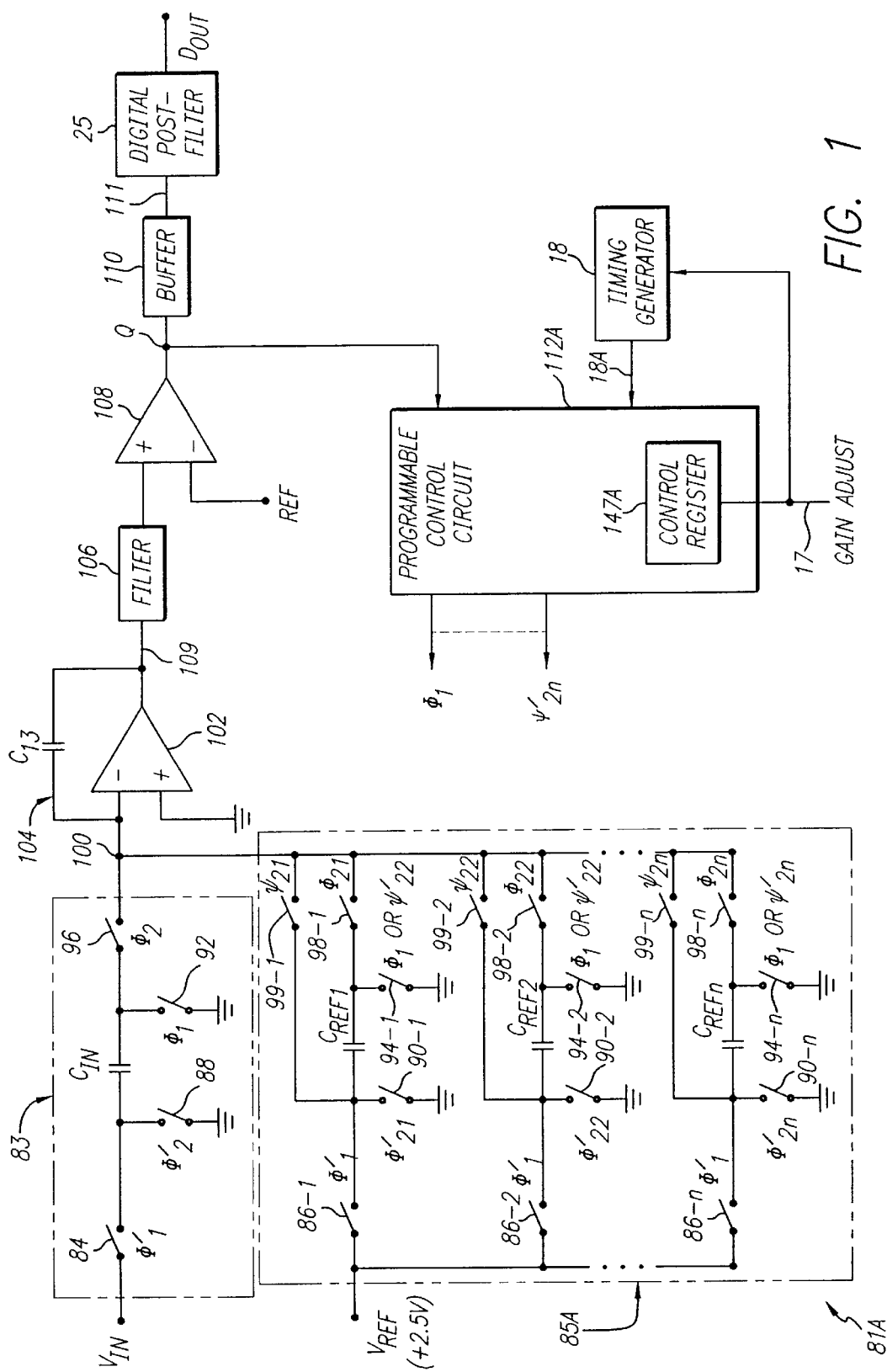
FIG. 1 is a schematic diagram of a programmable gain delta sigma analog-to-digital converter of the present invention having a single ended input.

Referring to FIG. 1, delta sigma modulator 81A includes a switched capacitor sampling circuit 83 having an input conductor to which the analog input signal $V_{IN}$ is applied. (Note that where convenient the same or similar reference numerals are used to designate similar or corresponding parts in FIGS. 1 and 2 as in prior art FIG. 4.) A switch 84 controlled by $\phi_1'$ couples $V_{IN}$ to one terminal of input sampling capacitor $C_{IN}$ and to one terminal of a switch 88 controlled by $\phi_2'$. Note that the timing diagram of FIG. 3A shows the waveforms of the various clock signals in FIG. 1. $C_{IN}$ can be 12 picofarads. The other terminal of input sampling capacitor $C_{IN}$ is connected to one terminal of a switch 96 controlled by $\phi_2$ and one terminal of a switch 92 controlled by $\phi_1$. The second terminals of switches 88 and 92 are connected to ground. The second terminal of switch 96 is connected by a charge summing conductor 100 to the inverting input of operational amplifier 102, which, with integrating capacitor $C_{13}$ coupled between its output 109 and inverting input, constitutes an integrator 104. The non-inverting input of operational amplifier 102 is connected to ground.

To sample $V_{IN}$, $\phi_2$ and $\phi_2'$ (FIG. 3) are set to low levels to open switches 88 and 96, and $\phi_1$ and $\phi_1'$ are set to high levels to close switches 84 and 92. $C_{IN}$ then is charged to $V_{IN}$ volts, i.e., $V_{IN}$ is "sampled". To "transfer" the resulting sampled charge between $C_{IN}$ and integrating capacitor $C_{13}$, switches 84 and 92 are opened, and switches 88 and 96 are closed so the sampled charge is transferred between $C_{IN}$ and $C_{13}$ via charge summing conductor 100.

Switched capacitor circuit 85A functions to sample a feedback reference voltage and transfer the resulting sampled feedback charge between a selected feedback reference capacitance and integrating capacitor $C_{13}$ according to the output decision of comparator 108. Each of switches 86-1,2 . . . n has a first terminal connected to a feedback reference voltage $V_{REF}$, where, in the described embodiment, n is equal to 16 and also is equal to the maximum selectable gain of delta sigma analog-to-digital converter 81A. A second terminal of each of switches 86-1,2 . . . n is connected to a first terminal of a corresponding feedback reference voltage sampling capacitor $C_{REF1,2 \ldots n}$ and also to a first terminal of a corresponding switch 90-1,2 . . . n. The second terminals of switches 90-1,2 . . . n are connected to ground. The first terminals of capacitors $C_{REF1, \ldots n}$ are connected to the first terminals of switches 99-1,2 . . . n, respectively. The second terminals of switches 99-1,2 . . . n are connected to charge summing conductor 100. The second terminals of feedback reference voltage sampling capacitors $C_{REF1,1 \ldots n}$ are connected to the first terminals of switches 94-1,2 . . . n, respectively, and also to first terminals of switches 98-1,2 . . . n, respectively. The second terminals of switches 94-1,2 . . . n are connected to ground. The second terminals of switches 98-1,2 . . . n are connected to charge summing conductor 100. Switches 86-1,2 . . . n are controlled by $\phi_1'$. Switches 90-1,2 . . . n are controlled by $\Phi_{21,2 \ldots n}$, respectively. Switches 94-1,2 . . . n are controlled by $\phi_1$ or $\psi'_{21,2 \ldots n}$, respectively, depending on whether the output Q of comparator 108 is a "1" (high) or a "0" (low), as indicated in the timing diagram of FIG. 3A. Switches 98-1,2 . . . n are controlled by $\Phi_{21,2 \ldots n}$, respectively. Switches 99-1,2 . . . n are controlled by $\psi_{21,2 \ldots n}$, respectively. (The above mentioned switches and the switches in subsequently described FIG. 2 all can be MOS transistors.)

Thus, the various capacitors $C_{REF1,2 \ldots n}$ can be selectively connected in parallel to provide a capacitance $C_{REF}$ (TOTAL) that can have various values between $C_R$ to n times $C_R$, where $C_R$ is the capacitance of each of capacitors $C_{REF1,2 \ldots n}$. In the described embodiment, $C_R$ can be 1 picofarad. The number n of such capacitors can be chosen to be equal to the highest gain desired for delta sigma modulator 81A.

The output 109 of integrator 104 is connected to the input of an analog filter 106. The output of filter 106 is connected to the non-inverting input of a comparator 108, the inverting input of which is connected to ground. The output Q of comparator 108 supplies a sequence of digital pulses (which represent the average amplitude of $V_{IN}$) to the input of a digital buffer 110. The output of buffer 110 is applied to the input of a digital post-filter 25 which performs the function of filtering the digital stream of pulses on the output 111 of buffer 110 to thereby provide a digital number $D_{OUT}$ that is a precise digital representation of $V_{IN}$.

The output Q of comparator 108 also is applied to an input of a programmable control circuit 112A that performs the function of supplying the various clock signals applied to operate $V_{IN}$ sampling circuit 83 and $V_{REF}$ sampling circuit 85A. The timing diagram of FIG. 3A shows the waveforms of the various above mentioned clock signals which effectuate the sampling and charge-transferring functions so as to produce the selected gain. The desired gain of delta sigma modulator 81A is provided by the user as a gain adjustment input 17 to gain control register 147A in programmable control circuit 112A. Various implementations of programmable control circuit 112A and gain control register 147A can be easily accomplished by one skilled in the art, and therefore are not described in detail.

The gain of a delta sigma modulator is proportional to the expression $$\frac{C_{IN}}{C_{REF(TOTAL)}},$$

where $C_{IN}$ is the capacitance of the analog input sampling capacitor and $C_{REF(TOTAL)}$ is the selected reference feedback capacitance, as generally explained in U.S. Pat. No. 4,851,841 (Sooch) entitled "GAIN SCALING OF OVER-SAMPLED ANALOG-TO-DIGITAL CONVERTERS" and the article "Design Methodology for ΣΔM" by Agrawal and Shenoi, IEEE Transactions on Communications, vol. COM-31, pp. 360–370, March 1983. Note that the above expression assumes that $V_{IN}$ and $V_{REF}$ are sampled onto $C_{IN}$ and $C_{REF}$, respectively, at exactly the same rate or frequency. The gain of the delta sigma analog-to-digital converter is the same as the gain of the delta sigma modulator portion thereof if the gain of the following portions of the analog-to-digital converter following the delta sigma modulator portion is unity.

According to the present invention, $V_{IN}$ and $V_{REF}$ are sampled by the corresponding sampling capacitances $C_{IN}$ and $C_{REF(TOTAL)}$ onto the integrating capacitor C13 at exactly the same rate. The gain is selected or adjusted by changing the effective feedback reference sampling capacitance $C_{REF(TOTAL)}$ that is charged during sampling of $V_{REF}$ and then transferred to integrating capacitor C13. This is in direct contrast to changing the sampling rate of $C_{REF}$ relative to the rate of sampling $V_{IN}$ as in the closest prior art (the above mentioned McCartney et al. patent). The "effective" feedback reference sampling capacitance $C_{REF(TOTAL)}$ is selected by operating the above described switches in capacitive switching circuit 85A to, in effect, connect a preselected number of reference feedback capacitors $C_{REF1,2 \ldots n}$ in parallel or sequentially sample them individually in order to obtain a selected "effective" value of $C_{REF(TOTAL)}$ and hence a corresponding selected value of gain between 1 and n.

Specifically, in FIG. 1, the gain of delta sigma analog-to-digital converter 81A is selected by causing programmable control unit 112A to operatively sample $V_{REF}$ and transfer the resulting sampled charge between integrating capacitor 13 and a selected number of equal reference feedback capacitors $C_{REF}$, $C_{REF2}$ . . . $C_{REFn}$. In the preferred embodiment, each of the individual feedback reference sampling capacitors $C_{REF1,2 \ldots n}$ has the same capacitance, 1 picofarad. For the lowest selectable delta sigma modulator gain of unity, all of $C_{REF1,2 \ldots n}$ are "operatively" connected in parallel during sampling of $V_{REF}$. For the highest selectable value (n) of gain, only one of $C_{REF1,2 \ldots n}$ is operatively connected to sample $V_{REF}$.

To increase the gain of delta sigma analog-to-digital converter 81A, programmable control circuit 112A is operated (in response to gain information entered into control register 147A) to control the above switches so as to cause the ratio $(C_{IN})/(C_{REF(TOTAL)})$ to have a particular value. In this expression, $C_{REF(TOTAL)}$ is equal to the total capacitance of all of the capacitors $C_{REF1,2 \ldots n}$ which operatively sample $V_{REF}$ and transfer the resulting sampled charge between the selected capacitors $C_{REF1,2 \ldots n}$ and integrating capacitor C13. The ratio of the capacitance of input sampling capacitor $C_{IN}$ to the net or total effective reference sampling capacitance $C_{REF(TOTAL)}$ including the selected ones of $C_{REF1}$, $C_{REF2}$ . . . $C_{REFn}$ is equal to the gain of delta sigma modulator of analog-to-digital converter 81A.

Figure 4:
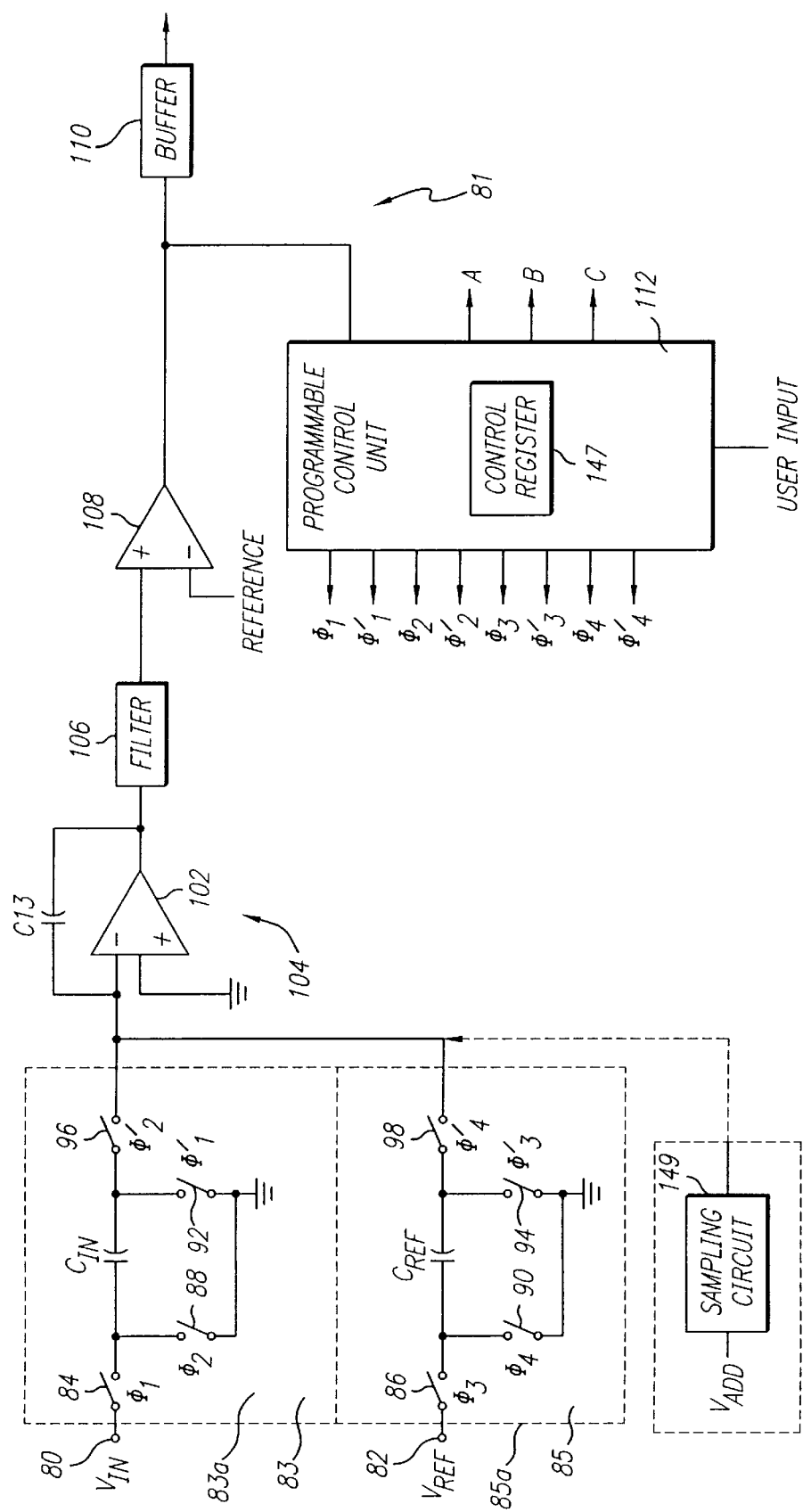
FIG. 4 is a schematic diagram of a prior art programmable gain delta sigma analog-to-digital converter.

Note that programmable control circuit 112A of the present invention never adjusts the relative sampling rates of sampling circuits 83 and 85A. Only the relative capacitances of the input sampling capacitor $C_{IN}$ and the value of $C_{REF(TOTAL)}$ are adjusted. In contrast, the ratio of the capacitances of sampling capacitors $C_{IN}$ and $C_{REF}$ in prior art FIG. 4 is constant, but the relative sampling rate of sampling circuits 85 to the sampling rate of circuit 83 is adjusted to change the gain of delta sigma modulator 81.

Those skilled in the art will understand that decreasing $C_{REF(TOTAL)}$ to increase the gain of delta sigma analog-to-digital converter 81A results in a loss of its dynamic range. This occurs because the reference feedback signal includes a charge error component that is equal to $$\sqrt{kT/C_{REF(TOTAL)}},$$

and that charge error component increases more rapidly with decreasing $C_{REF(TOTAL)}$ than the other components of the reference feedback signal. Consequently, the signal-to-noise ratio, i.e., the dynamic range, of the delta sigma analog-to-digital converter is degraded when the gain thereof is increased by reducing $C_{REF(TOTAL)}$.

Also, those skilled in the art will understand that changing $C_{REF(TOTAL)}$ alters the frequency response characteristics of delta sigma modulator 81A, because changing the gain of delta sigma modulator 81A as described above changes the slope of its gain-bandwidth curve and the location of the unity-gain point thereof, just as an amplifier has a gain-bandwidth product that "rolls off" at higher frequencies.

In accordance with one aspect of the invention, the common sampling rate used for both sampling circuits 83 and 85A in FIG. 1 is increased proportionally to the selected gain of delta sigma modulator 81A. In FIG. 1, timing generator 18 adjusts the frequency of a sampling rate signal 18A proportionally to the gain adjustment signal on conductor 17 in accordance with subsequently described Table 1. This causes programmable control circuit 112A to increase the sampling rate of circuits 83 and 85A. (One skilled in the art can readily provide various suitable implementations of timing generator 18 to produce signal 18A, so the details are omitted.) As subsequently explained, this "recovers" some of the "dynamic range" or signal-to-noise ratio of delta sigma analog-to-digital converter 81A that otherwise is lost as a result of decreasing $C_{REF(TOTAL)}$ to increase the gain.

Note that such increasing of the common sampling frequency of $V_{IN}$ and $V_{REF}$ does not affect the gain of the delta sigma modulator of delta sigma analog-to-digital converter 81A (or subsequently described delta sigma analog-to-digital converter 81B), but does result in more sampled charge being transferred to integrating capacitor $C_{13}$. This results in more effective use of the "full scale" sampling charge accumulated on integrating capacitor $C_{13}$ to increase the signal levels of the output of amplifier 102 relative to various noise sources, such as the above mentioned $kT/C_{REF(TOTAL)}$ noise, flicker noise, etc., which occur in integration amplifier 102, filter 106, and comparator 108. Consequently, the signal-to-noise ratio of delta sigma analog-to-digital converter 81A is improved.

Also, those skilled in the art will realize that increasing the rate of sampling by circuits 83 and 85A reduces the kT/C noise normally attributed to $C_{IN}$ by $\sqrt{N}$, where N is the factor by which the sampling rate is increased.

A primary offset error for delta sigma modulator 81A is produced by charge injection errors in both the input sampling circuit 83 and the feedback reference voltage sampling circuit 85A. The above described technique for increasing the common sampling frequency of $C_{IN}$ and $C_{REF(TOTAL)}$ causes such charge injection errors to be proportional to the gain selected for delta sigma modulator 81A. Such proportionality allows the above mentioned offset error to be easily predicted and corrected as a linear function of the selected gain by a subsequent calibration function. In contrast, the approach of prior art FIG. 4 adjusts the gain by changing the ratio of the input and feedback reference sampling frequencies. This causes the sum of the charge injection errors of the sampling circuits 83a and 85a in prior art FIG. 4 to vary in a non-linear fashion with respect to the selected gain. This makes a calibration correction of the delta sigma modulator offset error more difficult.

Finally, the technique of increasing the common sampling frequency proportionally to the selected gain not only improves the signal-to-noise ratio and improves the bandwidth characteristics of delta sigma modulator 81A, it also improves the feedback loop stability in delta sigma modulator 81A, by causing the feedback transfer function to remain constant.

The above described increasing of the common sampling rate of $C_{IN}$ and $C_{REF(TOTAL)}$ also "dynamically cancels" mismatch errors of the individual, equal-value capacitors $C_{REF1,2\ldots n}$ if the different individual ones of $C_{REF1,2\ldots n}$ selected to contribute to $C_{REF(TOTAL)}$ are consecutively sampled during a particular comparator decision cycle. This technique tends to average the capacitance mismatch errors over the comparator decision cycle. For example, if the maximum value of gain (n) is selected, the corresponding minimum value of $C_{REF(TOTAL)}$ is equal to $C_R$, which in the described prototype is 1 picofarad. To recover dynamic range lost by decreasing $C_{REF(TOTAL)}$, each of $C_{REF1,2\ldots n}$ is sampled once during each comparator decision cycle instead of sampling $C_{REF1}$ n times. Consequently, the mismatches between $C_{REF1,2\ldots n}$ are averaged.

Digital filter 25 can be readily adapted by those skilled in the art to "notch out", i.e., average, the effects of such capacitive mismatch errors. That is, instead of averaging the capacitive mismatches during one comparator decision cycle the capacitors could be selected so as to average out the mismatches at some other frequency associated with operation of the digital filter. For example, the oversampling of the various $C_{REF1,2\ldots n}$ can occur every other (or even every third, etc.) comparator decision cycle rather than every cycle; in any case, the capacitive mismatch errors can be readily averaged or "notched out" by digital filter 25.

Figure 2:
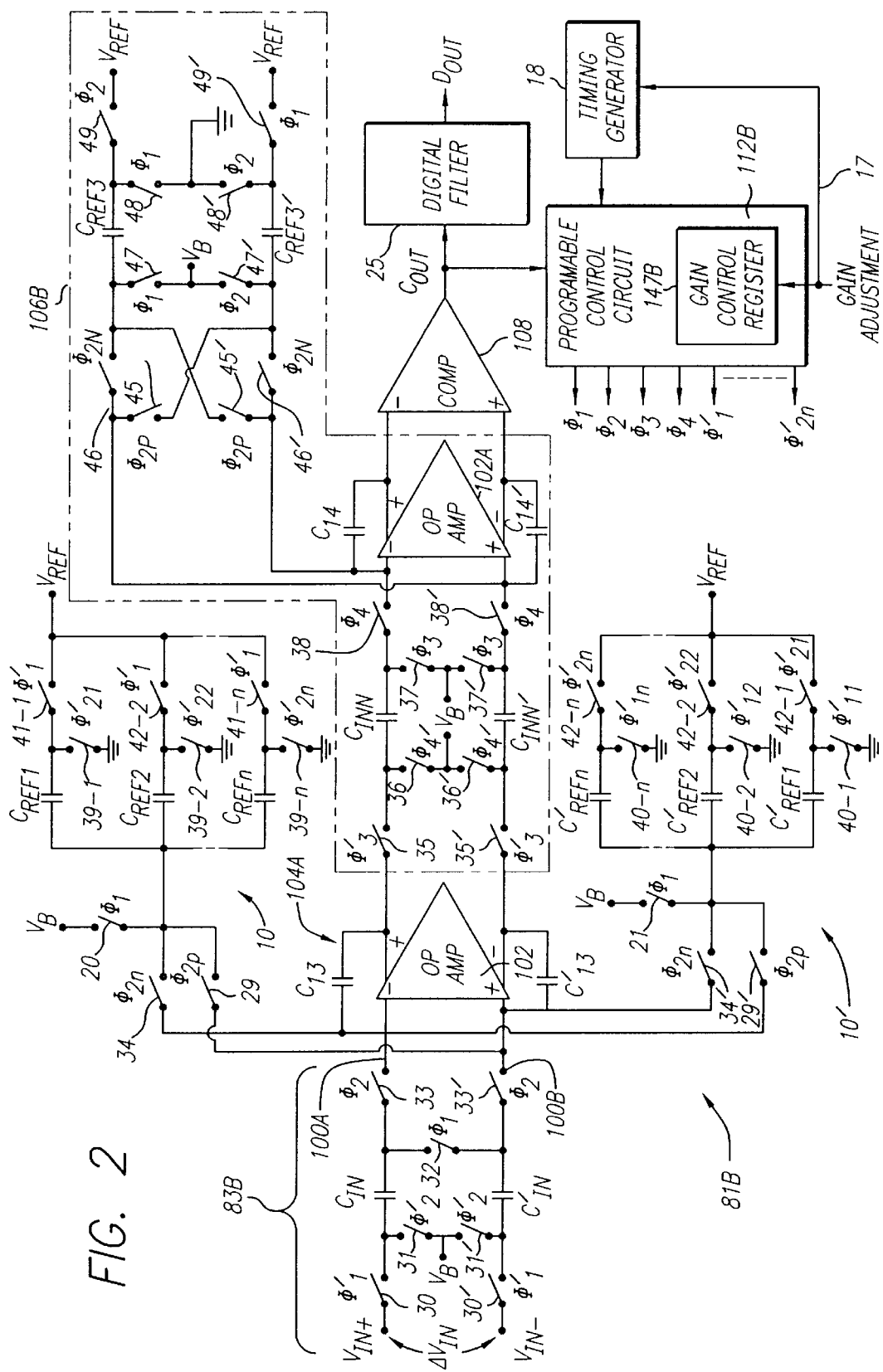
FIG. 2 is a schematic diagram of a differential input programmable gain delta sigma analog-to-digital converter of the present invention.
Figure 3A:
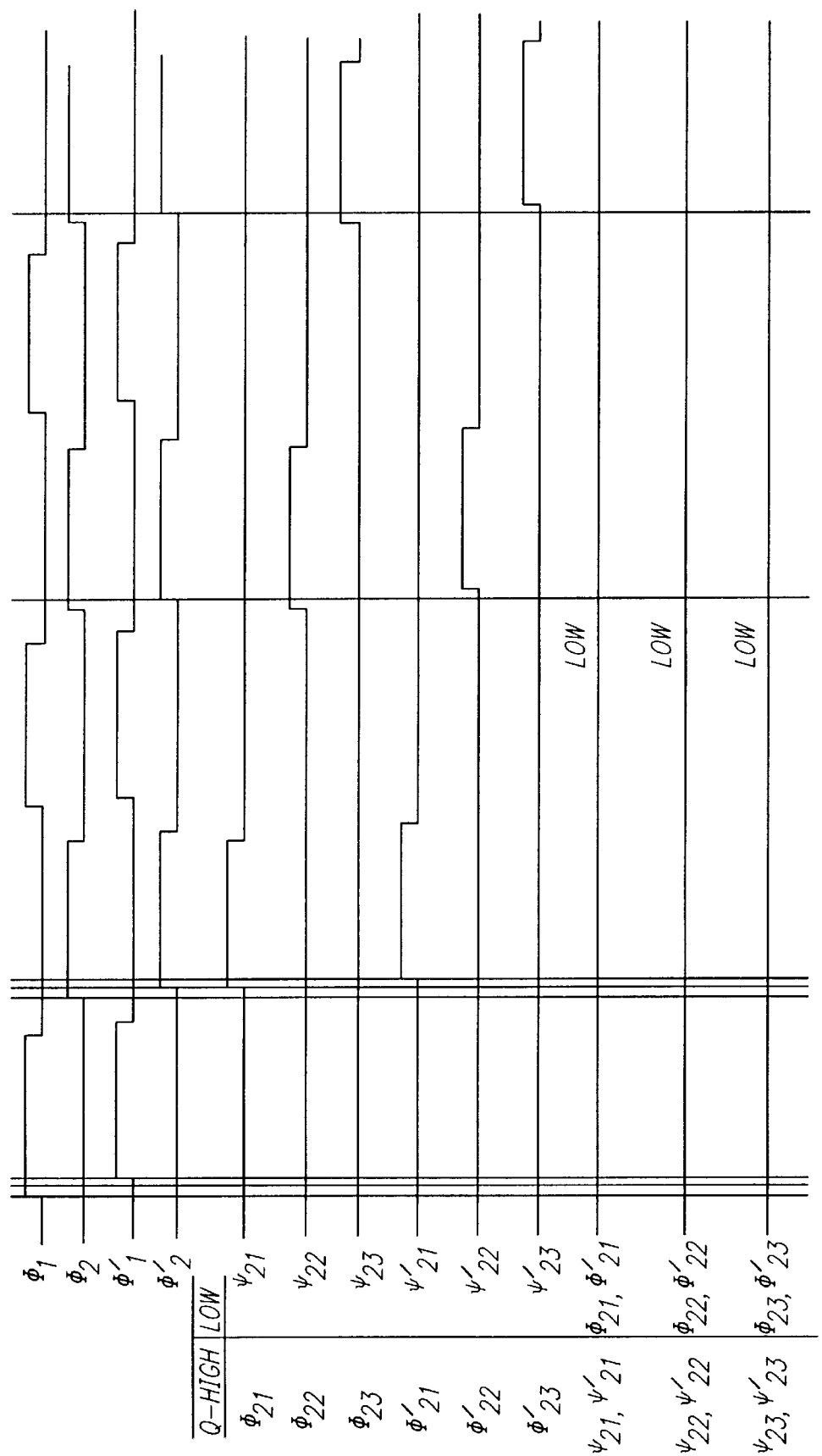
FIG. 3A is a timing diagram showing the waveforms of the clock signals applied to the delta sigma analog-to-digital converter of FIG. 1.

Referring to FIG. 2, delta sigma analog-to-digital converter 81B shows the presently preferred embodiment of the invention, in which a differential analog input signal $\Delta V_{IN}$, equal to the difference between $V_{IN}^+$ and $V_{IN}^-$, is applied between the input terminals. The basic techniques described above for providing programmable gain and recovery of dynamic range are essentially the same for the circuit of FIG. 2 as for the circuit of FIG. 1. However, the switched capacitor circuit 83B for sampling $\Delta V_{IN}$ of FIG. 2 includes two equal sampling capacitors $C_{IN}$ and $C_{IN}'$ (which may be 12 picofarads), two corresponding charge transfer switches 33 and 33', and two corresponding charge summing conductors 100A and 100B connected to the (−) and (+) inputs of integrator operational amplifier 102, respectively.

Switch 30 couples $V_{IN}^+$ to one terminal of $C_{IN}$ and one terminal of switch 31. The other terminal of switch 31 is connected to a bias voltage $V_B$, which may be ground. The other terminal of $C_{IN}$ is connected to one terminal of switch 32 and one terminal of transfer switch 33, the other terminal of which is connected to charge summing conductor 100A. Similarly, switch 30' couples $V_{IN}^-$ to one terminal of $C_{IN}'$ and one terminal of switch 31'. The other terminal of 31' is connected to $V_B$. A second terminal of $C_{IN}'$ is connected to a second terminal of switch 32 and to one terminal of transfer switch 33'. The other terminal of transfer switch 33' is connected to charge summing conductor 100B. Switches 30 and 30' are controlled by $\phi_2'$, as shown, and switches 31 and 31' are controlled by $\phi_2'$. Switch 32 is controlled by $\phi_1$, and switches 33 and 33' are controlled by $\phi_2$, as shown. (Note that all of the clock signals in FIG. 2 are shown in the timing diagram of FIG. 3B and are generated by programmable control circuit 112B. Also note that in FIG. 3B, $\phi_{11}'$, $\phi_{12}'$ and $\phi_{13}'$ are shown; for convenience, $\phi_{14,15\ldots 1n}'$ are omitted, but continue the "unstaggered" pattern of pulses shown for $\phi_{11}'$, $\phi_{12}'$ and $\phi_{13}'$. A similar comment is applicable to $\phi_{24,25\ldots 2n}'$, which, for convenience also are not shown.)

Programmable feedback reference capacitor circuit 10 is coupled to charge summing conductor 100A by switch 34, and to charge summing conductor 100B by switch 29. Programmable feedback reference capacitor circuit 10' is coupled to charge summing conductor 100B by switch 34' and to charge summing conductor 100A by switch 29'. Sampling capacitor $C_{IN}$ is coupled by switch 33 to charge summing conductor 100A, and sampling capacitor $C_{IN}'$ is coupled by switch 33' to charge summing conductor 100B. Charge summing conductor 100A is connected to the (−) input of operational amplifier 102 and to one terminal of integrating capacitor $C_{13}$, the other terminal of which is connected to the (+) output of operational amplifier 102. Charge summing conductor 100B is connected to the (+) input of operational amplifier 102 and to one terminal of integrating capacitor $C_{13}'$, the other terminal of which is connected to the (−) output of operational amplifier 102.

Switched reference feedback capacitor circuit 10 includes switch 20 coupling the left terminals of 1 picofarad capacitors $C_{REF1,2\ldots n}$ to $V_B$ which may be +2.5 volts. The right terminals of $C_{REF1,2\ldots n}$ are coupled by switches 41-1,2 . . . n to $V_{REF}$, and by switches 39-1,2 . . . n, respectively, to ground. Similarly, switched reference feedback capacitor circuit 10' includes switch 21 coupling the left terminals of 1 picofarad capacitors $C_{REF1,2\ldots n}'$ to $V_B$. The right terminals of $C_{REF1,2\ldots n}'$ are coupled by switches 42-1,2 . . . n to $V_{REF}$ and by switches 40-1,2 . . . n, respectively, to ground.

An analog filter 106B that corresponds to filter 106 in FIG. 1 includes a second switched capacitor sampling circuit, a third switched capacitor circuit, and a second integrator. The second switched capacitor circuit includes switches 35,35',36,36',37,37',38 and 38', and sampling capacitors $C_{INN}$ and $C_{INN}'$ coupled as shown between the outputs of operational amplifier 102 and the inputs of operational amplifier 102A. The third switched capacitor circuit includes switches 45,45',46,46',47,47',48,48',49 and 49', and capacitors $C_{REF3}$ and $C_{REF3}'$ coupled as shown between $V_{REF}$ and the inputs of operational amplifier 102A. The second integrator includes integrating capacitors $C_{14}$ and $C_{14}'$ and operational amplifier 102A, the + and − outputs of which are connected to the − and + inputs, respectively, of comparator 108. The output COUT of comparator 108 is coupled to the input of digital filter 25 and to an input of program control circuit 112B. Programmable control circuit 112B, timing generator 18, and digital filter 25 are structurally similar to and are similarly connected to the corresponding elements in the embodiment of FIG. 1. FIG. 3B shows the timing diagram of the various clock signals applied to the switches as indicated in FIG. 2.

Table 1 below shows the sampling frequency $f_s$ versus the analog-to-digital converter gain for the circuits of FIGS. 1 and 2.

TABLE 1

| Analog to-Digital Converter Gain | Input and feedback Capacitor Sampling frequency relative to Comparator Decision Frequency $f_s$ | $C_{REF(TOTAL)}$ |
|---|---|---|
| 1 | $1 \times f_s$ | 16pf |
| 2 | $2 \times f_s$ | 8pf |
| 4 | $4 \times f_s$ | 4pf |
| 8 | $8 \times f_s$ | 2pf |
| 16 | $16 \times f_s$ | 1pf |

FIG. 2 describes a circuit which may be used for single power supply operation. Note that in capacitive switching circuit 10 (which always functions to "take" charge from integrating capacitor $C_{13}$ during a transfer cycle), all of $C_{REF1,2...n}$ in capacitive switching circuit 10 are charged to the difference between $V_B$ and $V_{REF}$) during the reference sampling phase $\phi_1'$. During the next transfer phase, i.e., during $\phi_{2i}$, the selected one of switches 39-1,2 . . . n connects the right terminal of the selected $C_{REF1,2...n}$ to ground. None of the right terminals thereof can be "pulled" below ground by transient signals occurring on conductor 10 while turning on any of switches 39-1,2 . . . n, which are n channel MOSFETs. Consequently, none of the other switches (MOSFETs) 39-1,2 . . . n can be accidentally turned on by an "electrically floating" source or drain electrode that has been shifted below ground. Therefore, no loss of sampled charge through such an accidently turned on MOSFET or junction diode can occur. This, of course, would be undesirable because it would cause a loss of linearity of the analog-to-digital converter. In capacitive switching circuit 10', which always operates to "give" charge to integrating capacitor $C_{13}'$ during a transfer cycle, always charges only the "selected" $C_{REF1,2...n}$ to $V_B$ volts by connecting its left terminal to $V_B$ and its right terminal to ground during $\phi_1$ and $\phi'_{1i}$. There is no possibility that any electrically floating nodes of switches 42-1,2 . . . n can go lower than ground and accidentally turn on a MOSFET switch and causing loss of charge during the subsequent transfer cycle.

At the present time, the best mode of practicing the invention is the assignee's recently introduced ADS1210 delta sigma analog-to-digital converter.

While the invention has been described with reference to several particular embodiments thereof, those skilled in the art will be able to make the various modifications to the described embodiments of the invention without departing from the true spirit and scope of the invention. It is intended that all combinations of elements and steps which perform substantially the same function in substantially the same way to achieve the same result are within the scope of the invention, conceivably, $C_{REF(TOTAL)}$ can be made programmable in other ways than by the described selective parallel connection or sequential sampling of individual capacitors, for example by selective series connection or series-parallel connection of individual capacitors or by use of a voltage-variable capacitance such as a PN junction capacitor. The effect of making $C_{REF(TOTAL)}$ programmable is to make the "effective" feedback voltage and ultimately, the feedback charge, programmable. In some cases, the feedback charge might be made programmable in ways other than by making $C_{REF(TOTAL)}$ programmable, for example by supplying and transferring a programmable current into the integrator capacitor.

Various charge sampling and transferring circuits other than those described above can be used. Also note that the analog input sampling capacitors $C_{IN}$ can be "segmented" similarly to the above described "segmenting" of $C_{REF}$ such that to select higher gain a value of $C_{IN(TOTAL)}$ could be increased without changing the sampling rate; mismatches between the segmented input sampling capacitors could be averaged out between comparator decision cycles by the digital output filter, as previously described.

In the embodiments of both FIGS. 1 and 2, the capacitive switching circuits sample the analog input and then transfer sampled charges between the sampling capacitors and the integrating capacitors. In each case, the transfer of sampled charge can be thought of as either a "give" (i.e., non-inverting) transfer of charge from a sampling capacitor to an integrating capacitor or a "take" (i.e., inverting) transfer of charge from an integrating capacitor to a sampling capacitor. Suitable capacitive switching circuits and reference voltages can be adapted such that a particular such circuit always functions to produce a "give" charge transfer, always functions to produce a "take" charge transfer, or performs both "give" and "take" charge transfers functions, depending on the output decision of the comparator 108.

What is claimed is:

1. A programmable gain delta sigma analog-to-digital converter, comprising in combination:

(a) first and second analog input terminals receiving a differential analog input voltage therebetween;

(b) first and second charge summing conductors;

(c) a first integrator including an amplifier and a first integrating capacitor coupled between a first input of the amplifier and a first output of the amplifier and a second integrating capacitor coupled between a second input of the amplifier and a second output of the amplifier;

(d) a first capacitive switching circuit including first and second input sampling capacitors, first sampling switch circuitry coupled to charge the first and second input sampling capacitors according to voltages on the first and second analog input terminals, and first transfer switch circuitry coupled to the first and second input sampling capacitors and the first and second charge summing conductors to transfer charge between the first input sampling capacitor and the first integrating capacitor and to transfer charge between the second sampling capacitor and the second integrating capacitor;

(e) a comparator having first and second inputs coupled to the first and second outputs, respectively, of the amplifier, the comparator also having an output;

(f) a digital filter coupled to receive a stream of digital pulses produced by the comparator and adapted to produce a digital number that precisely represents the differential analog input voltage in response to the stream of digital pulses;

(g) a second capacitive switching circuit including a plurality of substantially equal reference sampling capacitors, second sampling switch circuitry selectively coupling a feedback reference voltage to the reference sampling capacitors, respectively, to selectively charge them, and second transfer switch circuitry selectively coupling the reference sampling capacitors of the second capacitive switching circuits, respectively, to transfer charge between selectively coupled reference sampling capacitors of the second capacitive switching circuit and the first integrating capacitor;

(h) a third capacitive switching circuit including a plurality of reference sampling capacitors, third sampling switch circuitry selectively coupling the feedback reference voltage to the reference sampling capacitors, respectively, of the third capacitive switching circuit to selectively charge them, and third transfer switch circuitry selectively coupling the reference sampling capacitors, respectively, of the third capacitive switching circuit to transfer charge between selectively coupled reference sampling capacitors of the third capacitive switching circuit and the second integrating capacitor; and (i) programmable gain control circuitry responsive to a gain signal coupled to the output of the comparator and adapted to cause the first and second capacitive switching circuits to sample the differential analog input voltage and the feedback reference voltage, respectively, at the same rate and selectively couple the reference sampling capacitors of the first and second capacitive switching circuits to the first and second integrating capacitors and to the feedback reference voltage to effectuate transfer of sampled charge between the first and second sampling capacitors and the first and second integrating capacitors so that the amount of sampled feedback reference charge in each transfer relative to the amount of sampled input charge in each transfer is inversely proportional to a selected gain represented by the gain signal.

2. The programmable gain delta sigma analog-to-digital converter of claim 1 wherein the second sampling switch circuitry of the second capacitive switching circuit includes a first switch coupled between a reference voltage and first terminals of the plurality of reference sampling capacitors of the second capacitive switching circuit and a plurality of second switches coupled between the feedback reference voltage and second terminals of the plurality of reference sampling capacitors, respectively, of the second capacitive switching circuit.

3. The programmable gain delta sigma analog-to-digital converter of claims 2 wherein the second transfer switch circuitry of the second capacitive switching circuit includes a third switch coupled between the first charge summing conductor and the first terminals of the plurality of reference sampling capacitors, and a plurality of fourth switches coupled between another reference voltage and the second terminals of the plurality of reference sampling capacitors, respectively, of the second capacitive switching circuit.

4. The programmable gain delta sigma analog-to-digital converter of claim 3 wherein the first switch, the plurality of second switches, the third switch, and the plurality of fourth switches are controlled by a plurality of clock pulses, respectively, according to the selected gain and a "zero" logic level produced by the comparator.

5. The programmable gain delta sigma analog-to-digital converter of claim 1 wherein the third sampling switch circuitry of the third capacitive switching circuit includes a fifth switch coupled between a reference voltage and first terminals of the plurality of reference sampling capacitors of the third capacitive switching circuit and a plurality of sixth switches coupled between another reference voltage and second terminals of the plurality of reference sampling capacitors, respectively, of the third capacitive switching circuit.

6. The programmable gain delta sigma analog-to-digital converter of claim 5 wherein the third transfer switch circuitry of the third capacitive switching circuit includes a seventh switch coupled between the second integrating capacitor and the first terminals of the plurality of reference sampling capacitors of the third capacitive switching circuit, and a plurality of eighth switches coupled between the feedback reference voltage and the second terminals of the reference sampling capacitors of the third capacitive switching circuit, respectively.

7. The programmable gain delta sigma analog-to-digital converter of claim 6 wherein the fifth switch, the plurality of sixth switches, the seventh switch and the plurality of eight switches are controlled by a plurality of clock pulses, respectively, according to the selected gain and a "one" logic level produced by the comparator.

8. The programmable gain delta sigma analog-to-digital converter of claim 1 including a filter coupling the first and second outputs of the amplifier to the first and second inputs of the comparator.

9. The programmable gain delta sigma analog-to-digital converter of claim 8 wherein the filter includes a fourth capacitive switching circuit coupling the first and second outputs of the amplifier to first and second inputs of a second integrator, first and second outputs of the second integrator being coupled to the first and second inputs, respectively, of the comparator.

10. The programmable gain delta sigma analog-to-digital converter of claim 1 wherein the first sampling switch circuitry includes a first switch coupled between the first analog input terminal and a first terminal of the first input sampling capacitor and a second switch coupled between the second analog input terminal and a first terminal of the second input sampling capacitor, and a third switch coupled between second terminals of the first and second input sampling capacitors.

11. The programmable gain delta sigma analog-to-digital converter of claim 10 wherein the first capacitive switching circuitry includes fourth and fifth switches coupled between the first terminals of the first and second input sampling capacitors, respectively, and a bias voltage, a sixth switch coupled between the second terminal of the first integrating capacitor and the first charge summing conductor, and a seventh switch coupled between the second terminal of the second integrating capacitor and the second charge summing conductor.

12. The programmable gain delta sigma analog-to-digital converter of claim 1 wherein the programmable gain control circuitry includes sampling rate control circuitry adapted to increase the common sampling rate of the first and second capacitive switching circuits generally proportionally to the preselected gain, to improve dynamic range of the delta sigma analog-to-digital converter.

13. A programmable gain delta sigma analog-to-digital converter, comprising in combination:

(a) an analog input terminal receiving an analog input voltage;

(b) a charge summing conductor;

(c) an integrator including an amplifier and an integrating capacitor coupled between a first input of the amplifier and a first output of the amplifier;

(d) a first capacitive switching circuit including an input sampling capacitor, first sampling switch circuitry coupled to the analog input terminal and the input sampling capacitor to charge the input sampling capacitor to the input voltage, and first transfer switch circuitry coupled to the input sampling capacitor and the charge summing conductor to transfer charge between the input sampling capacitor and the integrating capacitor;

(e) a comparator having a first input coupled to the first output of the amplifier, the comparator having an output;

(f) a digital filter coupled to receive a stream of digital pulses produced by the comparator and adapted to produce a digital number that precisely represents the analog input voltage in response to the stream of digital pulses;

(g) a second capacitive switching circuit including a plurality of substantially equal reference sampling capacitors, second sampling switch circuitry selectively coupling a feedback reference voltage to the reference sampling capacitors, respectively, to selectively charge the reference sampling capacitors, and second transfer switch circuitry selectively coupling the reference sampling capacitors, respectively, to the integrating capacitor to transfer charge between selectively coupled reference sampling capacitors and the integrating capacitor; and (h) programmable gain control circuitry responsive to a gain signal and coupled to the output of the comparator and adapted to cause the first and second capacitive switching circuits to sample the analog input voltage and the feedback reference voltage, respectively, at the same rate and selectively couple the reference sampling capacitors to both the feedback reference voltage and the integrating capacitor in response to the gain signal so as to effectuate transfer of sampled charge between the sampling capacitors and the integrating capacitor so that the amount of sampled feedback reference charge in each transfer thereof relative to the amount of sampled input charge in each transfer thereof is inversely proportional to a selected gain represented by the gain signal.

14. The programmable gain delta sigma analog-to-digital converter of claim 13 wherein the second sampling switch circuitry includes a plurality of first switches selectively coupling first terminals of the plurality of reference sampling capacitors, respectively, to the integrating capacitor as a result of a "zero" output level produced by the comparator, and a plurality of second switches selectively coupling second terminals of the plurality of reference sampling capacitors, respectively, to the integrating capacitor as a result of a "one" output level produced by the comparator.

15. The programmable gain delta sigma analog-to-digital converter of claim 14 wherein the plurality of first switches are controlled by a plurality of clock pulses, respectively, according to the selected gain and the "zero" output level produced by the comparator.

16. The programmable gain delta sigma analog-to-digital converter of claim 15 wherein the plurality of second switches are controlled by a different plurality of clock pulses, respectively, according to the selected gain and the "one" output level produced by the comparator.

17. The programmable gain delta sigma analog-to-digital converter of claim 13 wherein the programmable gain control circuitry includes sampling rate control circuitry adapted to increase the common sampling rate of the first and second capacitive switching circuits generally proportionally to the preselected gain, to improve dynamic range of the delta sigma analog-to-digital converter.

18. The programmable gain delta sigma analog-to-digital converter of claim 17 wherein the programmable gain control circuitry includes a control register adapted to store a number representative of the selected gain in response to a gain adjustment input signal, and the sampling rate control circuitry includes an input connected to receive the gain adjustment input signal.

19. The programmable gain delta sigma analog-to-digital converter of claim 13 further including a filter coupling the first input of the comparator to first output of the amplifier.

20. The programmable gain delta sigma analog-to-digital converter of claim 13 including a buffer coupled between an output of the comparator and an input of the digital filter.

21. The programmable gain delta sigma analog-to-digital converter of claim 13 wherein the analog input voltage is a single-ended analog input voltage.

22. A programmable gain delta sigma modulator, comprising in combination:

(a) an analog input terminal receiving an analog input voltage;

(b) an integrator including an amplifier and an integrating capacitor coupled between an input of the amplifier and an output of the amplifier;

(c) a first capacitive switching circuit including an input sampling capacitor, first sampling switch circuitry coupled to the analog input terminal and the input sampling capacitor to charge the input sampling capacitor to the input voltage, and first switching circuitry coupled to the input sampling capacitor and the charge summing conductor to transfer charge between the input sampling capacitor and the integrating capacitor;

(d) a comparator having an input coupled to the output of the amplifier, the comparator having an output;

(e) a second capacitive switching circuit including a plurality of substantially equal reference sampling capacitors, second sampling switch circuitry selectively coupling a feedback reference voltage to the reference sampling capacitors, respectively, to selectively charge the reference sampling capacitors, and second transfer switch circuitry selectively coupling the reference sampling capacitors, respectively, to the integrating capacitor to transfer charge between selectively coupled reference sampling capacitors and the integrating capacitor; and (f) programmable gain control circuitry responsive to a gain signal coupled to the output of the comparator and adapted to cause the first and second capacitive switching circuits to sample the analog input voltage and the feedback reference voltage, respectively, at the same rate and selectively couple the reference sampling capacitors to the feedback reference voltage and the integrating capacitor in response to the gain signal so as to effectuate transfer of sampled charge between the sampling capacitors and the integrating capacitor so that the amount of sampled feedback reference charge in each transfer thereof relative to the amount of sampled input charge in each transfer thereof is inversely proportional to a selected gain represented by the gain signal.

23. The programmable gain delta sigma modulator of claim 22 wherein the programmable gain control circuitry includes sampling rate control circuitry adapted to increase the common sampling rate of the first and second capacitive switching circuits generally proportionally to the selected gain, to recover dynamic range of the delta sigma analog-to-digital converter.

24. A method of changing the gain of a delta sigma modulator, comprising the steps of:

(a) providing
  i. an analog input terminal receiving an analog input voltage,
  ii. a first capacitive switching circuit including an input sampling capacitor circuit, sampling switch circuitry coupled to the analog input terminal and the input sampling capacitor circuit to charge the input sampling capacitor circuit to the input voltage, and transfer switch circuitry coupled to the input sampling capacitor circuit and the charge summing conductor to transfer charge between the input sampling capacitor circuit and an integrating capacitor, iii. an integrator including an amplifier and the integrating capacitor coupled between an input of the amplifier and an output of the amplifier, iv. a comparator having an input coupled to the output of the amplifier, the comparator having an output, and v. a second capacitive switching circuit including a reference sampling capacitor circuit, sampling switch circuitry coupling a feedback reference voltage to the reference sampling capacitor circuit to charge the reference sampling capacitor circuit, and transfer switch circuitry coupling the reference sampling capacitor circuit to the integrating capacitor to transfer charge between the reference sampling capacitor circuit and the integrating capacitor;

(b) providing a plurality of substantially equal sampling capacitors and associated sampling switch circuitry in a first one of the input sampling capacitor circuit and the reference sampling capacitor circuit and providing programmable gain control circuitry coupled to the output of the comparator and to the first and second capacitive switching circuits;

(c) entering gain control information representative of a preselected gain into the programmable gain control circuitry;

(d) operating the programmable gain control circuitry to cause the first one of the input sampling capacitor circuit and the reference sampling capacitor circuit to sample a first one of the analog input voltage and the feedback reference voltage onto a selected number of the plurality of sampling capacitors at a predetermined rate to charge the selected ones of the plurality of sampling capacitors to the first one of the analog input voltage and the feedback reference voltage, the selected number being determined according to the gain control information;

(e) operating the programmable gain control circuitry to cause the transfer switch circuitry to transfer sampled charge between the selected sampling capacitors and the integrating capacitor at the predetermined rate; and (f) operating the programmable gain control circuit to cause the other of the input sampling capacitor circuit and the reference sampling capacitor circuit to sample the other of the analog input voltage and the feedback reference voltage at the predetermined rate; and (g) operating the programmable gain control circuitry to transfer sampled charge between the integrating capacitor and the sampling capacitor circuit of the other of the input sampling capacitor circuit and the reference sampling capacitor circuit, the amount of sampled reference charge in each transfer thereof relative to the amount of sampled input charge in each transfer thereof being inversely proportional to the preselected gain.

25. The method of claim 24 including operating the programmable gain control circuitry to increase the common sampling rate of the first and second capacitive switching circuits generally proportionally to the preselected gain, to improve dynamic range of the delta sigma analog-to-digital converter.

26. A programmable gain delta sigma modulator, comprising in combination:

(a) an analog input terminal receiving an analog input voltage;

(b) an integrator including an amplifier and an integrating capacitor coupled between an input of the amplifier and an output of the amplifier;

(c) a first capacitive switching circuit including an input sampling capacitor circuit, first sampling switch circuitry coupled to the analog input terminal and the input sampling capacitor circuit to charge the input sampling capacitor circuit to the input voltage, and first switching circuitry coupled to the input sampling capacitor circuit and the charge summing conductor to transfer charge between the input sampling capacitor circuit and the integrating capacitor;

(d) a comparator having an input coupled to the output of the amplifier, the comparator having an output;

(e) a second capacitive switching circuit including a reference sampling capacitor circuit, second sampling switch circuitry coupling a feedback reference voltage to the reference sampling capacitor circuit to charge the reference sampling capacitor circuit, and second transfer switch circuitry coupling the reference sampling capacitor circuit to the integrating capacitor to transfer charge between the reference sampling capacitors and the integrating capacitor, one of the input sampling capacitor circuit and the reference sampling capacitor circuit including a plurality of substantially equal sampling capacitors and associated sampling switch circuitry adapted to couple an associated voltage to selected ones of the plurality of sampling capacitors to charge the selected ones of the plurality of sampling capacitors, and associated transfer switch circuitry adapted to transfer sampled charge between the selected ones of the plurality of sampling capacitors and the integrating capacitor; and (f) programmable gain control circuitry responsive to a gain signal coupled to the output of the comparator and adapted to cause the first and second capacitive switching circuits to sample the analog input voltage and the feedback reference voltage, respectively, at the same rate and selectively couple the reference sampling capacitors to the feedback reference voltage and the integrating capacitor in response to the gain signal so as to effectuate transfer of sampled charge between the sampling capacitors and the integrating capacitor so that the amount of sampled feedback reference charge in each transfer thereof relative to the amount of sampled input charge in each transfer thereof is inversely proportional to a selected gain represented by the gain signal.

27. A programmable gain delta sigma analog-to-digital converter, comprising in combination:

(a) an analog input terminal receiving an analog input voltage;

(b) a charge summing conductor;

(c) an integrator including an amplifier and an integrating capacitor coupled between a first input of the amplifier and a first output of the amplifier;

(d) a first capacitive switching circuit including an input sampling capacitor, first sampling switch circuitry coupled to the analog input terminal and the input sampling capacitor to charge the input sampling capacitor to the input voltage, and first transfer switch circuitry coupled to the input sampling capacitor and the charge summing conductor to transfer charge between the input sampling capacitor and the integrating capacitor;

(e) a comparator having a first input coupled to the first output of the amplifier, the comparator having an output;

(f) a digital filter coupled to receive a stream of digital pulses produced by the comparator and adapted to produce a digital number that precisely represents the analog input voltage in response to the stream of digital pulses;

(g) a second capacitive switching circuit including a plurality of reference sampling capacitors, second sampling switch circuitry selectively coupling a feedback reference voltage to the reference sampling capacitors, respectively, to selectively charge the reference sampling capacitors, and second transfer switch circuitry selectively coupling the reference sampling capacitors, respectively, to the integrating capacitor to transfer charge between selectively coupled reference sampling capacitors and the integrating capacitor, each of the reference sampling capacitors having the same capacitance except for a capacitance mismatch error; and (h) programmable gain control circuitry responsive to a gain signal and coupled to the output of the comparator and adapted to cause the first and second capacitive switching circuits to sample the analog input voltage and the feedback reference voltage, respectively, at the same rate and selectively couple the reference sampling capacitors to both the feedback reference voltage and the integrating capacitor in response to the gain signal so as to effectuate transfer of sampled charge between the sampling capacitors and the integrating capacitor so that the amount of sampled feedback reference charge in each transfer thereof relative to the amount of sampled input charge in each transfer thereof is inversely proportional to a selected gain represented by the gain signal, the programmable gain control circuitry dynamically canceling the effect of the mismatch errors by consecutively sampling different ones of the plurality of sampling capacitors to thereby time-average out the capacitance mismatch errors over a comparator decision cycle.

\* \* \* \* \*